United States Patent [19]

Akiyama et al.

[11] Patent Number: 4,561,916
[45] Date of Patent: Dec. 31, 1985

[54] METHOD OF GROWTH OF COMPOUND SEMICONDUCTOR

[75] Inventors: Masahiro Akiyama; Yoshihiro Akiyama, both of Tokyo, Japan

[73] Assignees: Agency of Industrial Science and Technology; Ministry of International Trade and Industry, both of Tokyo, Japan

[21] Appl. No.: 627,031

[22] Filed: Jul. 2, 1984

[30] Foreign Application Priority Data

Jul. 1, 1983 [JP] Japan .................... 58-118078

[51] Int. Cl.$^4$ .................. H01L 21/20; H01L 21/324
[52] U.S. Cl. .................... 148/175; 29/576 E; 29/576 T; 148/174; 148/DIG. 25; 148/DIG. 59; 148/DIG. 72; 148/DIG. 160; 156/612; 156/DIG. 104; 357/16; 427/87
[58] Field of Search ........... 148/174, 175; 29/576 E, 29/576 T; 427/87; 357/16; 156/612, DIG. 104

[56] References Cited

U.S. PATENT DOCUMENTS

| 3,454,434 | 7/1969 | Jackson et al. | 148/174 X |
| 3,473,978 | 10/1969 | Jackson et al. | 148/175 |
| 3,941,647 | 3/1976 | Druminski | 156/612 |
| 3,963,538 | 6/1976 | Broadie et al. | 148/175 |
| 3,963,539 | 6/1976 | Kemlage et al. | 148/175 |
| 3,985,590 | 10/1976 | Mason | 148/175 |
| 4,120,706 | 10/1978 | Mason | 148/175 |
| 4,174,422 | 11/1979 | Matthews et al. | 156/612 X |

FOREIGN PATENT DOCUMENTS 59-73499 4/1984 Japan .

OTHER PUBLICATIONS

Bischoff et al., "Selective Growth of GaAs" I.B.M. Tech. Discl. Bull., vol. 16, No. 9, Feb. 1974, p. 3072.

Primary Examiner—William G. Saba
Attorney, Agent, or Firm—Oblon, Fisher, Spivak, McClelland & Maier

[57] ABSTRACT

A method for the growth of a compound semiconductor comprises growing on a silicon substrate a polycrystalline layer of a desired Group III-V compound semiconductor or a crystal layer of the desired Group III-V compound semiconductor having inferior crystallinity, growing on the formed layer at least one layer of the same semiconductor as the desired Group III-V compound semiconductor and at least one layer of a Group III-V compound semiconductor having a lattice constant approximating the lattice constant of the desired Group III-V compound semiconductor, which layers are alternately disposed, and growing on the alternately disposed layers a layer of the desired Group III-V compound semiconductor.

16 Claims, 7 Drawing Figures

METHOD OF GROWTH OF COMPOUND SEMICONDUCTOR

BACKGROUND OF THE INVENTION

1. Field of the Invention

This invention relates to a method for the growth of a compound semiconductor, which comprises causing a Group III-V compound semiconductor to grow into a single crystal on a silicon (Si) substrate.

2. Description of Prior Art

A case has been reported in which a crystal of good quality was obtained by growing on a Si substrate a GaP as a particular Group III-V compound semiconductor having a lattice constant approximating the lattice constant of the Si. In the case of crystal of other compound semiconductors having a different lattice constant, it is difficult to obtain the growth of a crystal of good quality. If this growth takes place at all, there is obtained a grown layer of polycrystalline structure which assumes a milky surface. In the case of a GaAs, there has been an attempt to grow on a Si substrate a Ge whose lattice constant approximates that of GaAs and then grow a GaAs on the produced intermediate Ge. This method requires repetition of the work of crystal growth and entails the problem of auto-doping of Ge.

It has been proposed to form a single crystal layer of a Group III-V compound semiconductor on a plurality of the alternating layers of a Group III-V compound semiconductor and another Group III-V compound semiconductor having a lattice constant approximating the lattice constant of the aforementioned semiconductor grown in advance on the substrate of such a Group IV compound semiconductor as Ge or Si (Japanese Patent Application Disclosure SHO 59(1984)-73499). Although this method is capable of producing a single crystal layer of GaAs of good quality when the growth is made on a substrate of Ge, it fails to produce a single crystal layer of GaAs of good quality because of variance in lattice constant when the growth is made on a substrate of Si.

SUMMARY OF THE INVENTION

An object of this invention is to provide a method which enables a single crystal layer of a Group III-V compound semiconductor to be grown in good quality with high reproducibility on the Si substrate having a different lattice constant.

This object is accomplished by a method which comprises forming on a Si substrate a layer of a Group III-V compound semiconductor grown to an extent of retaining the component atoms thereof in insufficiently migrated state at low deposition temperatures, further forming thereon at least one layer each of a semiconductor similar to a Group III-V compound semiconductor aimed at and another Group III-V compound semiconductor having a lattice constant approximating the lattice constant of the aforementioned Group III-V compound semiconductor at conventional growth temperature, and finally growing thereon a layer of the Group III-V compound semiconductor aimed at. The grown layer of the Group III-V compound semiconductor thus obtained is a single crystal of good quality. The method described above produces this single crystal with high repeatability.

The other objects and characteristic features of this invention will become apparent to those skilled in the art as further disclosure is made in the following detailed description with reference to the accompanying drawings.

DESCRIPTION OF PREFERRED EMBODIMENT

Figure 1:
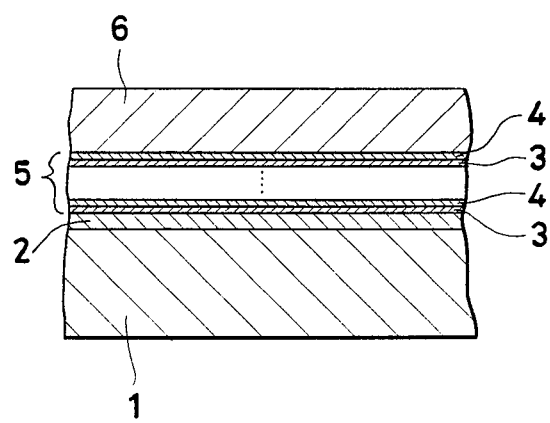
FIG. 1 is a cross sectional view illustrating the structure of a semiconductor layer produced by the method of this invention.

Now, this invention will be described with reference to FIG. 1. In the drawing, 1 denotes a Si substrate. On this Si substrate 1 is formed a layer 2 of either the same semiconductor as a desired Group III-V compound semiconductor or another Group III-V compound semiconductor having a lattice constant approximating the lattice constant of the aforementioned semiconductor. This layer 2 is a polycrystalline film which has such a low crystal growth temperature that its component atoms do not fully migrate on the substrate 1 or a film which, despite a relatively high crystal growth temperature, contains twins to exhibit inferior crystallinity and cannot be identified as either a polycrystal or a single crystal. When a GaAs is grown at a temperature somewhere around 450° C. up to about 600° C., the polycrystalline layer of the crystalline layer of inferior crystallinity is obtained as desired.

The thickness of the formed layer 2 falls in the range of 100 to 1000 Å. If the thickness of the layer 2 is in excess of 2000 Å, then a single crystal layer of a Group III-V compound semiconductor of good quality cannot be obtained.

The Group III-V compound semiconductors for which the present invention is intended are not limited to those whose lattice constants approximate the lattice constance of silicon. Such semiconductors as GaAs, and InP which have lattice constants differing from that of silicon are also embraced.

The other Group III-V compound semiconductors having lattice constants approximating that of the aforementioned semiconductor are GaAlAs as contrasted to GaAs and such combinations as AlInP and GaInP as contrasted to InP.

After the polycrystalline layer or crystal layer of inferior crystallinity 2 (hereinafter referred to as "polycrystalline layer") of either the same semiconductor as the desired Group III-V compound semiconductor or the semiconductor having a lattice constant approximating the lattice constant of the aforementioned semiconductor has been formed on the Si substrate 1, then there is formed on this polycrystalline layer 2 a layer 5 in which at least on layer each of the same semiconductor 3 as the desired Group III-V compound semiconductor and a Group III-V compound semiconductor having a lattice constant approximating the lattice constant of the semiconductor 3 are alternately grown (hereinafter these two layers will be referred to as "alternating single crystal layers").

After the polycrystalline layer 2 has been grown on the Si substrate 1, they are heated to a temperature high enough for the growth of a single crystal such as, for example, a temperature in the neighborhood of 700° C. for GaAs, to start alternating growth of the semiconductor layers 3, 4 sequentially. The thickness of each of the layers of these semiconductors 3, 4 desirably falls in the range of 100 to 1000 Å. At least one layer of each of the semiconductors 3, 4 has to be formed to obtain desired results. Although the effect derived from these layers increases as the number of layers increases, any addition to this number beyond five or six gives no appreciable increase in effect.

The alternating layers 5 of single crystal can be effectively grown on the polycrystalline layer 2 as described above. A possible reason for this growth of the alternating layers 5 is that since the substrate 1 and the polycrystalline layer 2 are heated to 700° C. prior to the growth of the alternating single crystal layers 5, the polycrystalline layer 2 transforms itself into a single crystal layer as though undergoing an annealing treatment and, as the result, the alternating layers formed thereon are enabled to form single crystals.

After the two intermediate layers 2, 5 have been formed as described above, the desired Group III-V compound semiconductor layer 6 is grown thereon. Consequently, there is formed a single crystal semiconductor layer of good quality and perfectly flat faces. Moreover, the method of this invention produces this single crystal semiconductor layer with high reproducibility.

The sequential formation of the polycrystally layer, the alternating single crystal layers, and the Group III-V compound semiconductor layer on the Si substrate described above can be easily carried out by the known MO-CVD method. To be specific, it can be accomplished by first setting a Si substrate in place in a crystal growth apparatus, adjusting the temperature of the system and, at the same time, regulating the amounts of raw materials fed to the apparatus.

When the Group III-V compound semiconductor layer 6 was formed directly on the alternating single crystal layers 5 by omitting the formation of the polycrystalline layer 2 from the method of this invention, the growth of a layer of good quality depended on the kind of the Group III-V compound semiconductor used. When the Group III-V compound semiconductor layer 6 was formed directly on the polycrystalline layer 2, the growth of a layer of good quality could be obtained within a narrow range of crystal growth conditions, though with very poor reproducibility. In contrast, by the method of this invention, the growth of a layer of high quality can be obtained with high reproducibility even between Si and a Group III-V compound semiconductor such as, for example, GaAs, which has a different lattice constant.

In accordance with the method of this invention, since all the superposed layers including the intermediate layers are formed of Group III-V compound semiconductors, there is enjoyed an advantage that the undesired phenomenon of doping from the intermediate layers as experienced when Ge is used in such intermediate layers is completely eliminated. Further, since the GaAs layer can be formed on the Si substrate without requiring the use of an expensive and highly fragile substrate of GaAs, this method enjoys an advantage that a GaAs wafer of a large surface area can be easily obtained. Further, a device formed on the Si substrate and a device formed on the GaAs substrate can be organically connected to form an integral circuit. Thus, the wafers obtained by the method of this invention can be utilized as large substrates for parts such as of light-emitting diodes, solar cells and field effect transistors.

Further, since silicon has high thermal conductivity as compared with GaAs, this invention proves advantageous for obtaining power elements with such compound semiconductors as GaAs. Now, this invention will be described with reference to an example.

EXAMPLE

Figure 2A:
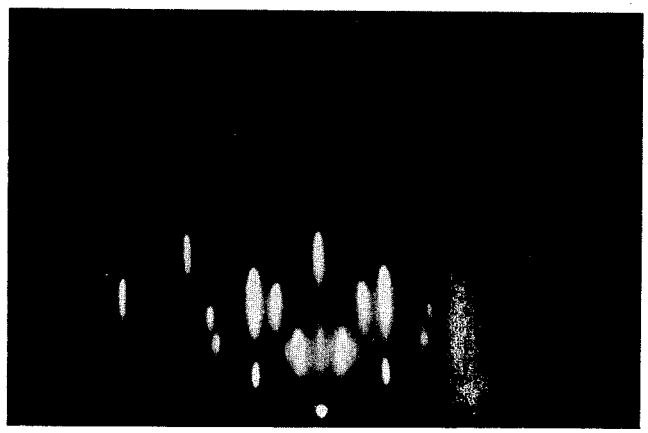
FIG. 2(a) is a photograph of a reflection electron beam defraction image of a polycrystalline layer formed on a Si substrate by the present invention.
Figure 2B:
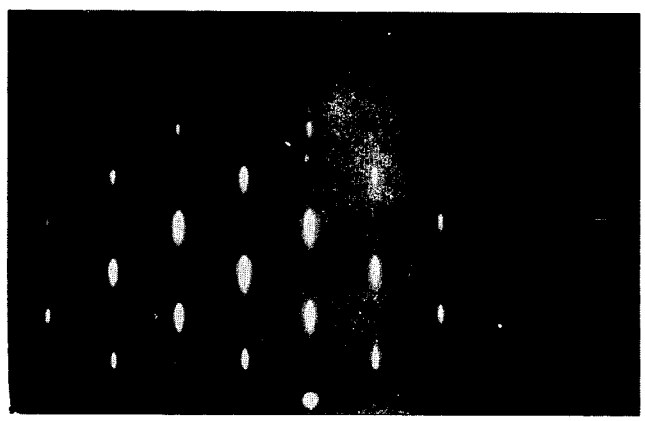
FIG. 2(b) is a photograph of a similar diffraction image of the aforementioned polycrystalline layer in an annealed state.
Figure 2C:
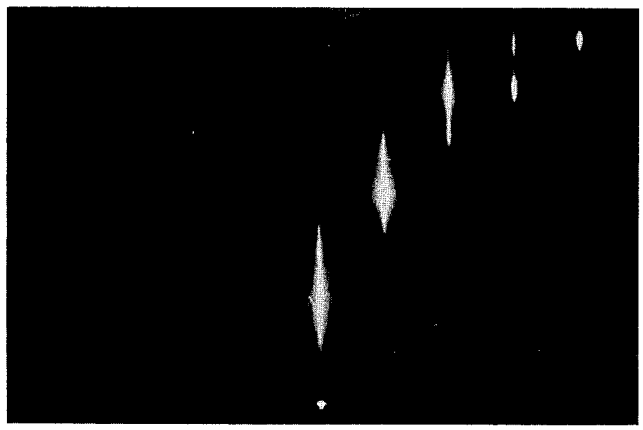
FIG. 2(c) is a photograph of a similar diffraction image of the uppermost layer of a multiplicity of alternating layers of single crystal grown on the aforementioned polycrystalline layer.

By the MO-CVD method, a GaAs layer of a thickness of 400 Å was grown at 450° C. on a silicon (100) substrate 50 mm in diameter. A photograph of a reflection electron beam diffraction image of the GaAs layer thus grown is shown in FIG. 2(a). A look at this photograph reveals that it was a film of inferior crystallinity including numerous twins. Then, the sample was heated to 700° C. and held at this temperature by way of annealing treatment. A photograph of a diffraction image of the GaAs layer after this treatment is shown in FIG. 2(b). The by-lattice points due to twins appearing in the photograph of FIG. 2(a) can no longer been seen, indicating that the annealing treatment improved the crystallinity. Subsequently, on the annealed GaAs layer, five layers each of GaAs and GaAlAs were alternately superposed, each in a thickness of 500 Å at 700° C. FIG. 2(c) is a photograph of a diffraction image of the GaAlAs and GaAs alternating layers formed as the uppermost layer. The pattern of spots appearing in FIG. 2(b) is replaced by a pattern of streaks, indicating that the flatness of surface was improved.

Figure 3:
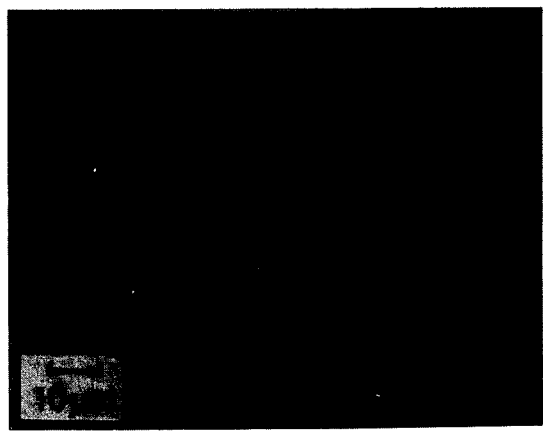
FIG. 3 is a microscopic photograph of a grown GaAs layer formed by the method of this invention.
Figure 4:
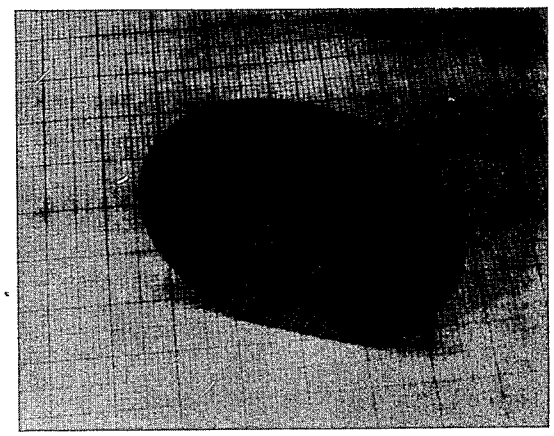
FIG. 4 is a photograph showing the aforementioned grown layer of GaAs in an overall view.

Now, on the intermediate layers thus grown, a GaAs layer was grown in a thickness of 3 μm at 700° C. A microscopic photograph of this GaAs layer is shown in FIG. 3 and an overall photograph of the formed GaAs layer is shown in FIG. 4. It is clearly seen in the photographs that the GaAs layer grew with perfect surface flatness.

Figure 5:
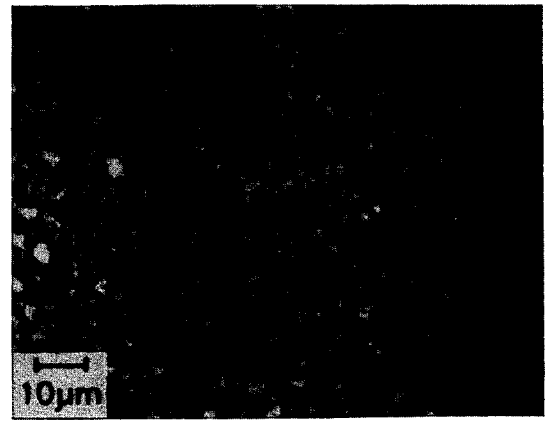
FIG. 5 is a microscopic photograph of the grown layer of GaAs directly formed on a Si substrate.

For the purpose of comparison, a GaAs layer was grown in a thickness of 3 μm directly on the Si (100) substrate by the MO-CVD method while omitting the formation of intermediate layers. A microscopic photograph of the surface of the formed GaAs layer is shown in FIG. 5. This photograph shows this GaAs layer to be a polycrystalline film.

What is claimed is:

1. A method for the growth of a compound semiconductor, which comprises growing on a silicon substrate a layer of the same semiconductor as a desired Group III-V compound semiconductor at low temperatures adequate for growth of polycrystals; growing on the formed layer at least one layer of the same semiconductor as the desired Group III-V compound semiconductor and at least one layer of a Group III-V compound semiconductor having a lattice constant approximating the lattice constant of the desired Group III-V compound semiconductor, which layers are alternately disposed, at a temperature adequate for growth of a single crystal; and growing thereon a layer of the desired Group III-V compound semiconductor.

2. A method according to claim 1, wherein the thickness of said polycrystalline layer falls in the range of 100 to 1000 Å.

3. A method according to claim 1, wherein said desired Group III-V compound semiconductor is GaAs.

4. A method according to claim 1, wherein said Group III-V compound semiconductor having a lattice constant approximating the lattice constant of said desired Group III-V compound semiconductor is GaAlAs.

5. A method for the growth of a compound semiconductor, which comprises growing on a silicon substrate a layer of a semiconductor having a lattice constant approximating the lattice constant of a desired Group III-V compound semiconductor at low temperatures adequate for growth of polycrystals; growing on the formed layer at least one layer of the same semiconductor as the desired Group III-V compound semiconductor and at least one layer of a Group III-V compound semiconductor having a lattice constant approximating the lattice constant of said desired Group III-V compound semiconductor, which layers are alternately disposed, at a temperature adequate for growth of a single crystal; and growing thereon a layer of the desired Group III-V compound semiconductor.

6. A method according to claim 5, wherein the thickness of said polycrystalline layer falls in the range of 100 to 1000 Å.

7. A method according to claim 5, wherein said desired Group III-V compound semiconductor is GaAs.

8. A method according to claim 5, wherein each of the semiconductors having a lattice constant approximating the lattice constant of said desired Group III-V compound semiconductor is GaAlAs.

9. A method for the growth of a compound semiconductor, which comprises growing on a silicon substrate a layer of the same semiconductor as a desired Group III-V compound semiconductor at low temperatures adequate for growth of crystals of inferior crystallinity; growing on the formed layer at least one layer of the same semiconductor as the desired Group III-V compound semiconductor and at least one layer of a Group III-V compound semiconductor having a lattice constant approximating the lattice constant of said desired Group III-V compound semiconductor, which layers are alternately disposed, at a temperature adequate for growth of a single crystal; and growing thereon a layer of the desired Group III-V compound semiconductor.

10. A method according to claim 9, wherein the thickness of said layer of crystals of inferior crystallinity falls in the range of 100 to 1000 Å.

11. A method according to claim 9, wherein said desired Group III-V compound semiconductor is GaAs.

12. A method according to claim 9, wherein said Group III-V compound semiconductor having a lattice constant approximating the lattice constant of said desired Group III-V compound semiconductor is GaAlAs.

13. A method for the growth of a compound semiconductor, which comprises growing on a silicon substrate a layer of a semiconductor having a lattice constant approximating the lattice constant of a desired Group III-V compound semiconductor at low temperatures adequate for growth of crystals of inferior crystallinity; growing on the formed layer at least one layer of the same semiconductor as the desired Group III-V compound semiconductor and at least one layer of a Group III-V compound semiconductor having a lattice constant approximating the lattice constant of said desired Group III-V compound semiconductor, which layers are alternately disposed, at a temperature adequate for growth of a single crystal; and growing thereon a layer of the desired Group III-V compound semiconductor.

14. A method according to claim 13, wherein the thickness of said layer of crystals of inferior crystallinity falls in the range of 100 to 1000 Å.

15. A method according to claim 13, wherein said desired Group III-V compound semiconductor is GaAs.

16. A method according to claim 13, wherein each of said semiconductors having a lattice constant approximating the lattice constant of said desired Group III-V compound semiconductor is GaAlAs.

* * * * *